(12) United States Patent
Hosaka

(10) Patent No.: US 10,948,819 B2
(45) Date of Patent: Mar. 16, 2021

(54) IMPRINT APPARATUS AND ARTICLE MANUFACTURING METHOD

(71) Applicant: CANON KABUSHIKI KAISHA, Tokyo (JP)

(72) Inventor: Takashi Hosaka, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 269 days.

(21) Appl. No.: 16/030,307

(22) Filed: Jul. 9, 2018

(65) Prior Publication Data

US 2019/0018316 A1 Jan. 17, 2019

(30) Foreign Application Priority Data

Jul. 12, 2017 (JP) .............................. JP2017-136438

(51) Int. Cl.
*G03F 7/00* (2006.01)
(52) U.S. Cl.
CPC .................................. *G03F 7/0002* (2013.01)
(58) Field of Classification Search
None
See application file for complete search history.

(56) References Cited

U.S. PATENT DOCUMENTS

2013/0038855 A1\* 2/2013 Yamamoto ............ G03F 7/2008
355/76
2015/0001749 A1\* 1/2015 Arai ....................... B82Y 10/00
264/40.1

FOREIGN PATENT DOCUMENTS

JP          2016072403 A      5/2016

\* cited by examiner

*Primary Examiner* — Timothy Kennedy
(74) *Attorney, Agent, or Firm* — Rossi, Kimms & McDowell LLP

(57) ABSTRACT

An imprint apparatus forms a pattern on a substrate by bringing a pattern region of a mold into contact with imprint material on the substrate and curing the imprint material. The mold has first and second surfaces. The first surface includes the pattern region and a peripheral region surrounding the pattern region. The second surface includes a held region. The imprint apparatus includes a mold driving mechanism to hold the held region of the mold and drive the mold, a mold conveyance mechanism to hold the peripheral region of the mold and convey the mold, and a controller to control the mold conveyance mechanism based on thickness between the peripheral region and the held region.

19 Claims, 12 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

In an imprint apparatus, a pattern is formed on a substrate by bringing a pattern region of a mold into contact with an imprint material on the substrate and curing the imprint material. The mold can be also referred to as a template or an original. The mold is held and driven by a mold driving mechanism. The mold driving mechanism can drive the mold so as to bring a pattern surface of the mold into contact with the imprint material on the substrate and separate the mold from the cured imprint material. Alternatively, the mold driving mechanism can drive the mold so as to align a shot region of the substrate and the pattern region of the mold. Since driving of the mold by the mold driving mechanism requires very high accuracy, it is difficult to increase the driving range of the mold driving mechanism. Hence, the mold is handed over from a mold conveyance mechanism to the mold driving mechanism after it is positioned with high accuracy.

However, as imprint techniques become more widespread, molds that have various thicknesses can appear. For example, other than a mold which is manufactured by processing a single quartz member, there is a mold which is manufactured by joining a first plate member and a second plate member. The latter mold has been disclosed in Japanese Patent Laid-Open No. 2016-72403. Also, even molds that are manufactured by the same type of manufacturing method may have various thicknesses due to, for example, a generational change.

For example, in a case in which the mold driving mechanism is to hold the upper surface of the mold, the mold conveyance mechanism can have an arrangement in which the mold is handed over to the mold driving mechanism in a state where the lower surface of the mold is held by the mold conveyance mechanism. In this case, if a method of positioning the height of the lower surface of the mold at a predetermined height is adopted when the mold conveyance mechanism is to hand over the mold to the mold driving mechanism, the position of the upper surface of the mold can change depending on the type of the mold. This requires the mold driving mechanism to have a stroke that can cope with such change. Alternatively, even in a case in which the mold conveyance mechanism holds the mold by chucking a side surface or the like of the mold, a similar problem can occur if the method of positioning the height of the lower surface of the mold at a predetermined height is adopted.

SUMMARY OF THE INVENTION

The present invention provides a technique advantageous in performing a handover of a mold between a mold driving mechanism and a mold conveyance mechanism regardless of the thickness of the mold.

One of aspects of the present invention provides an imprint apparatus that forms a pattern on a substrate by bringing a pattern region of a mold into contact with an imprint material on the substrate and curing the imprint material, wherein the mold has a first surface and a second surface on sides opposite to each other, the first surface including the pattern region and a peripheral region which surrounds the pattern region, the second surface including a held region, and the imprint apparatus comprises a mold driving mechanism configured to hold the held region of the mold and drive the mold, a mold conveyance mechanism configured to hold the peripheral region of the mold and convey the mold, and a controller configured to control, when handover of the mold is to be performed between the mold driving mechanism and the mold conveyance mechanism, the mold conveyance mechanism based on thickness information which indicates a distance between the peripheral region and the held region.

Further features of the present invention will become apparent from the following description of exemplary embodiments with reference to the attached drawings.

DESCRIPTION OF THE EMBODIMENTS

Exemplary embodiments of the present invention will be described hereinafter with reference to the accompanying drawings.

Figure 1:
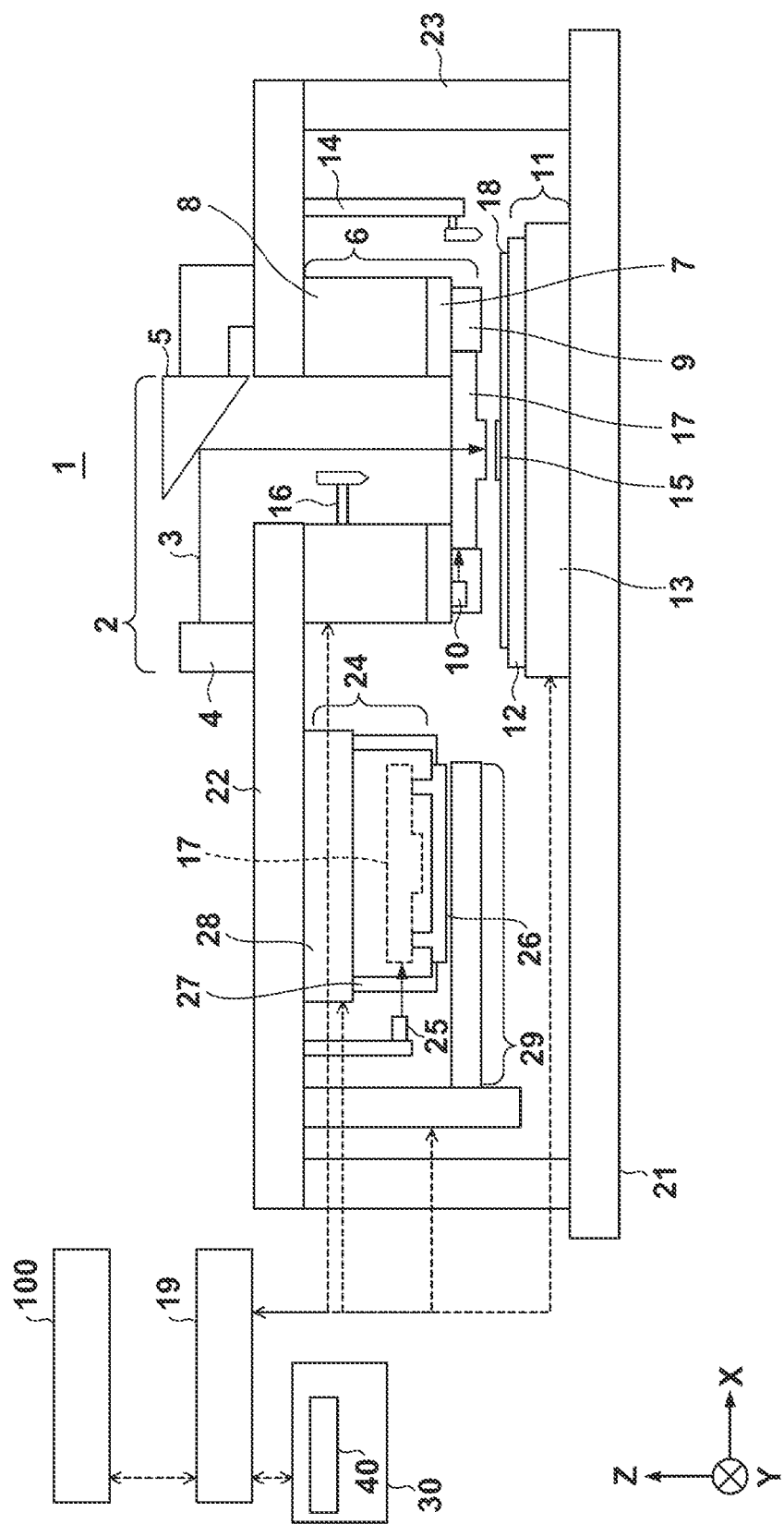
FIG. 1 is a schematic view showing the arrangement of an imprint apparatus according to an embodiment of the present invention.

FIG. 1 schematically shows the arrangement of an imprint apparatus 1 according to an embodiment of the present invention. The imprint apparatus 1 forms a pattern made of a cured product of an imprint material 15 on a substrate 18 by bringing the imprint material 15 on the substrate 18 into contact with a pattern region of a mold 17 and curing the imprint material 15.

A curable composition (to be also referred to as an uncured resin) that is cured by application of a curing energy 3 is used as the imprint material. An electromagnetic wave, heat, or the like is used as the curing energy. As the electromagnetic wave, for example, light such as infrared light, visible rays, ultraviolet light, or the like whose wavelength is selected from a range of 10 nm (inclusive) to 1 mm (inclusive) is used. The curable composition can be a composition that is cured by light irradiation or application of heat. Of these compositions, a photo-curable composition that is cured by light contains at least a polymerizable compound and a photopolymerization initiator, and may contain a non-polymerizable compound or solvent as needed. The non-polymerizable compound is at least a material selected from a group consisting of a sensitizer, a hydrogen donor, an internal mold release agent, a surfactant, an antioxidant, a polymer component, and the like. An imprint material may be supplied in a droplet form, an island form with droplets being chained together, or a film form onto a substrate. The viscosity (at 25° C.) of the imprint material is 1 mPa·s (inclusive) to 100 mPa·s (inclusive). Glass, a ceramic, a metal, a semiconductor, or a resin can be used as the material of a substrate. A member formed from a material different from the substrate may be formed on its surface, as needed. The substrate is, for example, a silicon wafer, a compound semiconductor wafer, or a silica glass wafer.

In this specification and the accompanying drawings, directions are shown in an X-Y-Z coordinate system in which a direction parallel to the surface of the substrate 18 forms an X-Y plane. Let an X direction, a Y direction, and a Z direction be the directions parallel to an X-axis, a Y-axis, and a Z-axis, respectively, in the X-Y-Z coordinate system. Let θX, θY, and θZ be rotation about the X-axis, rotation about the Y-axis, and rotation about the Z-axis, respectively. Control or driving with regard to the X-axis, the Y-axis, and the Z-axis means control or driving with regard to the direction parallel to the X-axis, the direction parallel to the Y-axis, and the direction parallel to the Z-axis, respectively. Further, control or driving with regard to a θX-axis, a θY-axis, and a θZ-axis means control or driving with regard to rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by values on the θX-axis, the θY-axis, and the θZ-axis. Positioning means controlling the position and/or attitude. Alignment can include the control of the position and/or attitude of at least one of the substrate and the mold.

The imprint apparatus 1 can include a curing unit 2, a mold positioning mechanism 24, a substrate driving mechanism 11, a mold driving mechanism 6, a mold conveyance mechanism 29, a dispenser 14, an alignment measurement device 16, a controller 19, and a memory 30. An external apparatus 100 can be arranged outside the imprint apparatus 1.

In FIG. 1, the mold 17 which is arranged in the mold positioning mechanism 24 is indicated by a dotted line and the mold 17 which is held by the mold driving mechanism 6 is indicated by a solid line. As exemplified in FIGS. 3A and 3B, the mold 17 has a first surface S1 and a second surface S2 that are on sides opposite to each to other. The first surface S1 includes a pattern region 33 and a peripheral region 34 which surrounds the pattern region 33. The second surface S2 includes a held region 35 which is held by the mold driving mechanism 6. The mold 17 can be formed from a material, for example, such as quartz, that can transmit the energy 3 (for example, ultraviolet rays). In the imprint apparatus 1, the mold 17 can be handled in an attitude in which the first surface S1 (pattern region 33) faces downward. The curing unit 2 can be formed, in one example, so as to irradiate the imprint material 15 with ultraviolet rays serving as the energy 3, and can include, for example, a light source 4 and an optical element 5 (for example, a lens, a mirror, a filter, or the like) that adjusts the ultraviolet rays from the light source 4.

The mold positioning mechanism 24 positions the mold 17, which is conveyed from outside of the imprint apparatus 1 by a conveyance device, so that the mold can be conveyed by the mold conveyance mechanism 29 to the mold driving mechanism 6 and handed over to the mold driving mechanism 6. The positioning of the mold 17 by the mold positioning mechanism 24 can be performed with respect to, for example, the X-axis, the Y-axis, and the θZ-axis. The mold positioning mechanism 24 can include, for example, a first measurement device 25, a mold conveyance chuck 26, a chuck holding mechanism 27, and a driving mechanism 28. Note that the mold conveyance chuck 26 can be understood as a component of the mold conveyance mechanism 29.

The first measurement device 25 is a measurement device that measures the mold 17 as a target. The first measurement device 25 can include, for example, a displacement sensor. The mold conveyance chuck 26 chucks (holds) and releases the mold 17. The chuck holding mechanism 27 chucks (holds) and releases the mold conveyance chuck 26. The chuck holding mechanism 27 is supported by a driving mechanism 28. The driving mechanism 28 can drive the chuck holding mechanism 27 with respect to the X-axis, the Y-axis, and the θZ-axis to position the mold 17 held via the chuck holding mechanism 27 and the mold conveyance chuck 26. Based on the measurement result of the first measurement device 25, the mold 17 is positioned by the driving mechanism 28 driving the chuck holding mechanism 27 relatively with respect to the mold conveyance mechanism 29.

Although only one first measurement device 25 is shown in FIG. 1, it is possible to arrange at least three first measurement devices 25. For example, in a case in which three first measurement devices 25 are to be arranged, two first measurement devices 25 can be arranged so as to measure a side surface which is almost parallel to the X-axis direction of the mold 17, and the remaining one first measurement device 25 can be arranged to measure a side surface which is almost parallel to the Y-axis direction of the mold 17. As a result, positioning in the Y-axis direction can be performed since it is possible to know the displacement amount in the Y-axis direction of the mold 17 from one of or the average value of the two measurement results by the two first measurement devices 25 capable of measuring a side surface which is almost parallel to the X-axis direction. Positioning in the X-axis direction can also be performed since it is possible to know the displacement amount in the X-axis direction of the mold 17 from the measurement result by the one first measurement device capable of measuring a side surface which is almost parallel to the Y-axis direction. Furthermore, rotation direction positioning about the θZ-axis can be performed since it is possible to know the rotational displacement amount with respect to the θZ-axis of the mold 17 from the difference information between the measurement results of the two first measurement devices capable of measuring a side surface almost parallel to the X-axis direction.

The substrate driving mechanism 11 holds the substrate 18 and can be formed so as to drive the substrate 18 about a plurality of axes (for example the three axes of the X-, Y-, and θZ-axes or preferably the six axes of X-, Y-, Z-, θX-, θY-, and θZ-axes). The substrate driving mechanism 11 can include a substrate chuck 12 and a driving mechanism 13. The substrate chuck 12 holds the substrate 18 by a chuck such as a vacuum chuck. The driving mechanism 13 drives the substrate 18 about the plurality of axes by driving the substrate chuck 12 about the plurality of axes.

The mold driving mechanism 6 holds the mold 17 and can be formed so as to drive the mold 17 about a plurality of axes (for example the three axes of the Z, θX, and θY-axes or preferably the six axes of X, Y, Z, θX, θY, and θZ-axes). The mold driving mechanism 6 can include a mold chuck 7, an actuator 8, a mold deforming mechanism 9, and a second measurement device 10. The mold chuck 7 holds the mold 17 by a chuck such as a vacuum chuck. The actuator 8 drives the mold 17 about the plurality of axes by driving the mold chuck 7 about the plurality of axes. The mold deforming mechanism 9 is a mechanism for correcting the shape of the mold 17, is arranged so as to surround the side surface of the mold 17, and corrects the shape of the mold 17 by applying a force on the side surface of the mold 17 or displacing the side surface of the mold. The second measurement device 10 is a measurement device that measures the side surface of the mold 17 and can be, more particularly, a displacement sensor.

The mold conveyance mechanism 29 conveys the mold 17 from the mold positioning mechanism 24 to the mold chuck 7 of the mold driving mechanism 6 and hands over the mold to the mold chuck 7. The mold conveyance mechanism 29 can be formed to convey the mold 17 by conveying the mold conveyance chuck 26 in a state in which the mold conveyance chuck 26 is held by a chuck such as a vacuum chuck.

The dispenser 14 arranges the imprint material 15 on the substrate 18. The dispenser 14 arranges the imprint material 15 on the substrate 18 by discharging (dropping) the imprint material 15 in a state in which the substrate 18 is driven by the substrate driving mechanism 11. The alignment measurement device 16 aligns the shot region of the substrate and the pattern region of the mold 17 by using a shot region mark of the substrate 18 and a mark of the mold 17.

The controller 19 controls the above-described components of the imprint apparatus 1, for example, the curing unit 2, the mold positioning mechanism 24, the substrate driving mechanism 11, the mold driving mechanism 6, the mold conveyance mechanism 29, the dispenser 14, and the alignment measurement device 16. The controller 19 can be formed from a PLD (Programmable Logic Device) such as an FPGA (Field Programmable Gate Array), an ASIC (Application Specific Integrated Circuit), a general-purpose computer installed with a program, or a combination of all or some of these components.

The memory 30 stores, for example, information necessary for controlling the imprint process, conveyance of the mold 17, and the conveyance of the substrate 18. The imprint process can include a process of bringing the pattern region of the mold 17 into contact with the imprint material 15 on the substrate 18, forming a pattern on the substrate 18 by curing the imprint material 15, and separating the mold 17 from the pattern. The imprint process can also include a process of arranging the imprint material 15 on the substrate 18 by using the dispenser 14. The memory 30 can include a non-volatile memory 40. The non-volatile memory 40 can be formed from, for example, an EEPROM or an MRAM (Magnetoresistive Random Access Memory). Alternatively, the non-volatile memory 40 can be formed from a volatile memory such as a DRAM or an SRAM which is backed up by a battery.

The imprint apparatus 1 can include a base structure 21 for holding the substrate driving mechanism 11, the curing unit 2, the mold driving mechanism 6, the mold positioning mechanism 24, the dispenser 14, a bridging structure 22 which supports the dispenser 14 and the mold conveyance mechanism 29, and a column 23 which supports the bridging structure 22. The mold conveyance mechanism 29 can be supported by the base structure 21 instead of the bridging structure 22. The imprint apparatus 1 can include a conveyance mechanism that conveys the mold 17 from outside the imprint apparatus 1 to the mold conveyance mechanism 29.

Figure 2A:
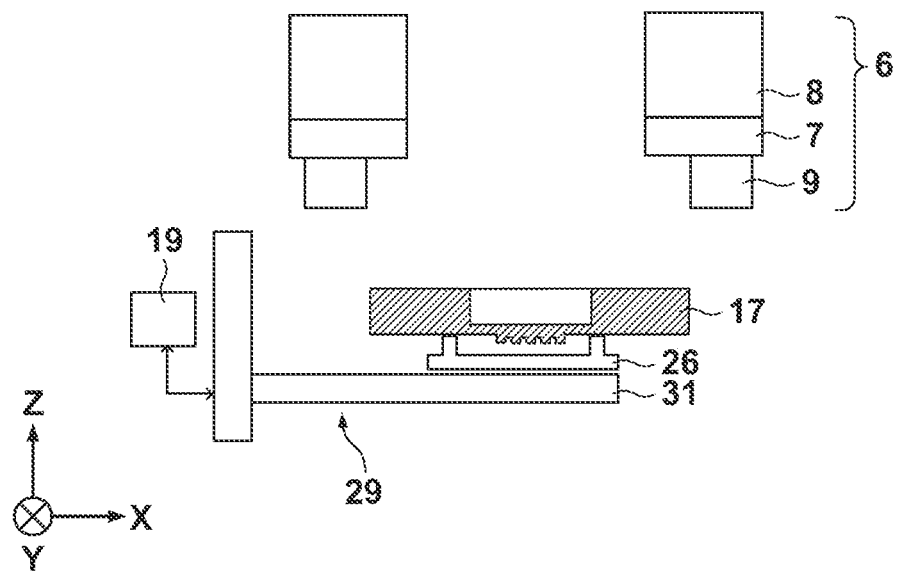
FIGS. 2A to 2D are schematic views showing a state in which a mold, which has been positioned by a mold positioning mechanism, is conveyed by a mold conveyance mechanism to a mold chuck of a mold driving mechanism.
Figure 2B:
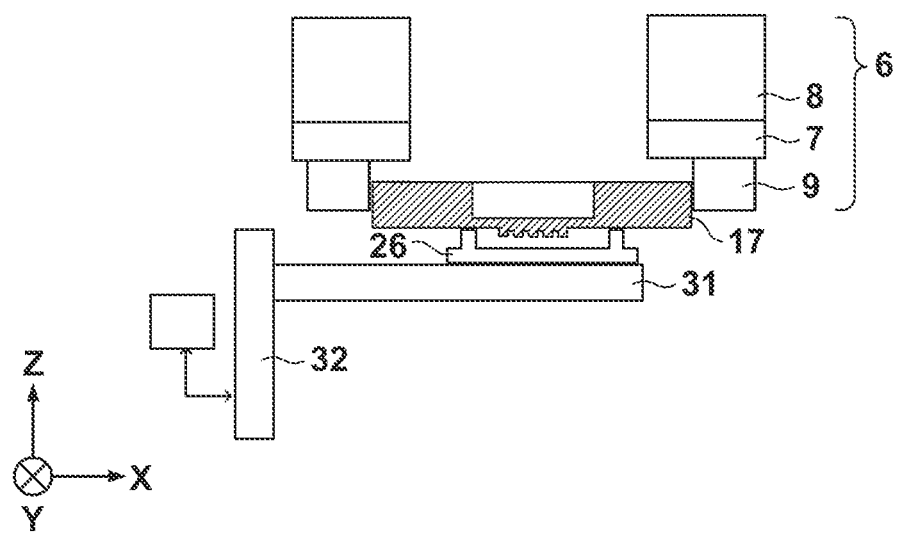

FIGS. 2A to 2D schematically show the mold 17, which has been positioned by the mold positioning mechanism 24, being conveyed to the mold chuck 7 of the mold driving mechanism 6 by the mold conveyance mechanism 29. First, as shown in FIG. 2A, the mold 17 is conveyed to a position immediately below the mold driving mechanism 6 by the mold conveyance mechanism 29. Next, as shown in FIG. 2B, the mold 17 is conveyed to a handover position by the mold conveyance mechanism 29. In this example, the mold 17 is conveyed to the handover position by relatively raising a table 31 with respect to a support unit 32. The position of the table 31 is detected by a sensor (not shown, for example, an encoder), and the table 31 can be driven based on this detection result.

Figure 2C:
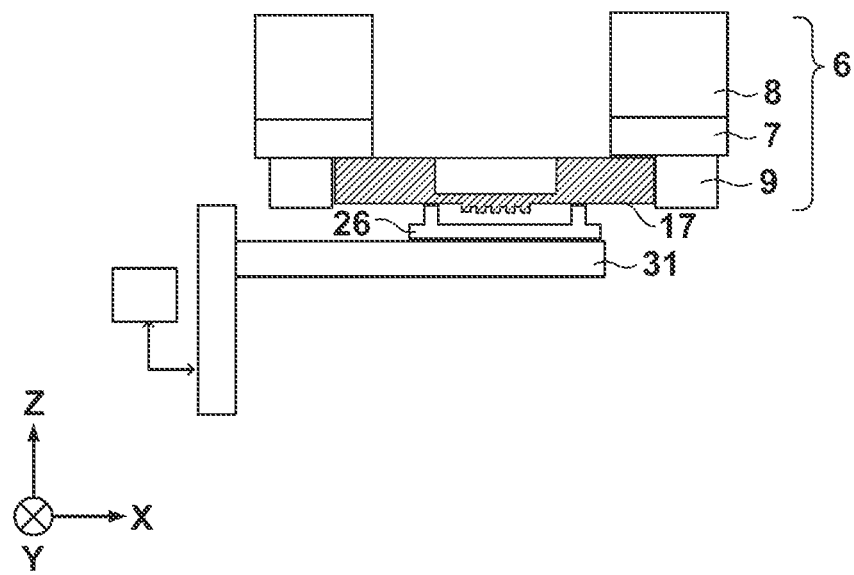
Figure 2D:
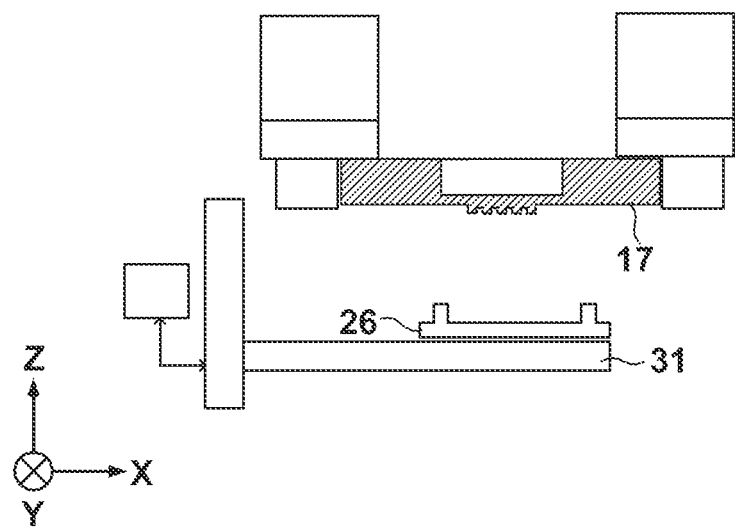

Next, as shown in FIG. 2C, the actuator 8 of the mold driving mechanism 6 lowers the mold chuck 7 and brings the mold chuck 7 into contact with the mold 17. Here, the lowering amount of the mold chuck 7 by the actuator 8 may be a preset amount or the lowering of the mold chuck 7 by the actuator 8 may be stopped by detecting the contact of the mold chuck 7 to the mold 17. Subsequently, as shown in FIG. 2D, the mold 17 is held by the mold chuck 7 and the table 31 of the mold conveyance mechanism 29 is lowered.

Figure 3A:
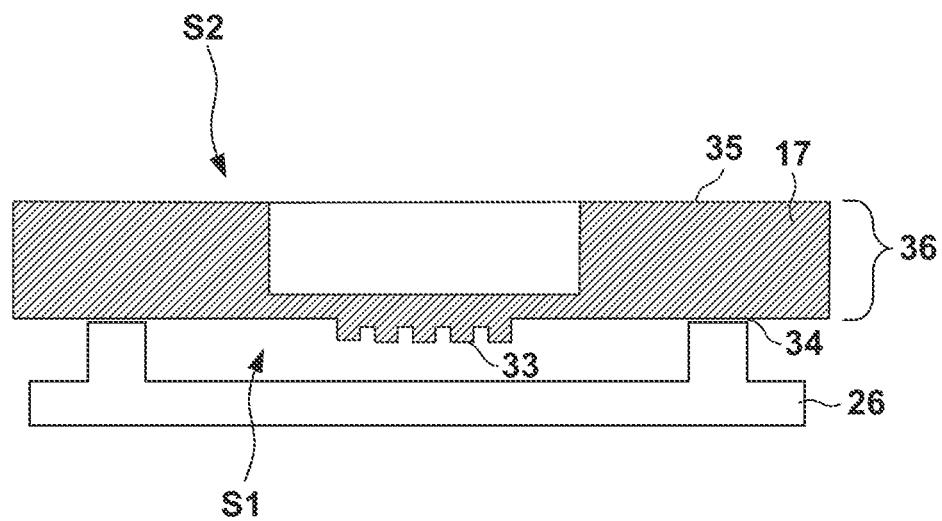
FIG. 3A is a schematic view showing a state in which a peripheral region of a mold of a first type is held by a mold conveyance chuck.
Figure 3B:
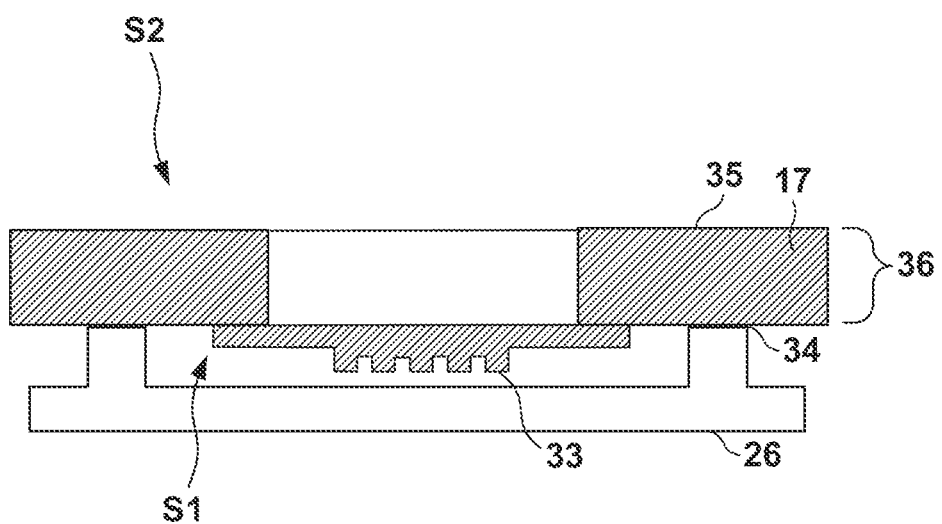
FIG. 3B is a schematic view showing a state in which a peripheral region of a mold of a second type is held by the mold conveyance chuck.

FIG. 3A schematically shows a state in which the peripheral region 34 of the mold 17 of a first type is held by the mold conveyance chuck 26. The mold 17 of the first type is manufactured by processing a single quartz member. FIG. 3B schematically shows a state in which the peripheral region 34 of the mold 17 of a second type is held by the mold conveyance chuck 26. The mold 17 of the second type can be manufactured by joining two members. The mold 17 of the first type and the mold 17 of the second type each have the first surface S1 and the second surface S2 which are on sides opposite to each other. The first surface S1 includes the pattern region 33 and the peripheral region 34 which surrounds the pattern region 33. The second surface S2 includes the held region 35 held by the mold driving mechanism 6. These points are characteristics in common between the mold 17 of the first type and the mold 17 of the second type. However, a thickness 36 of the mold 17 can differ between the mold 17 of the first type and the mold 17 of the second type. Here, the thickness 36 is the distance between the peripheral region 34 of the first surface S1 and the held region 35 of the second surface S2.

Figure 4A:
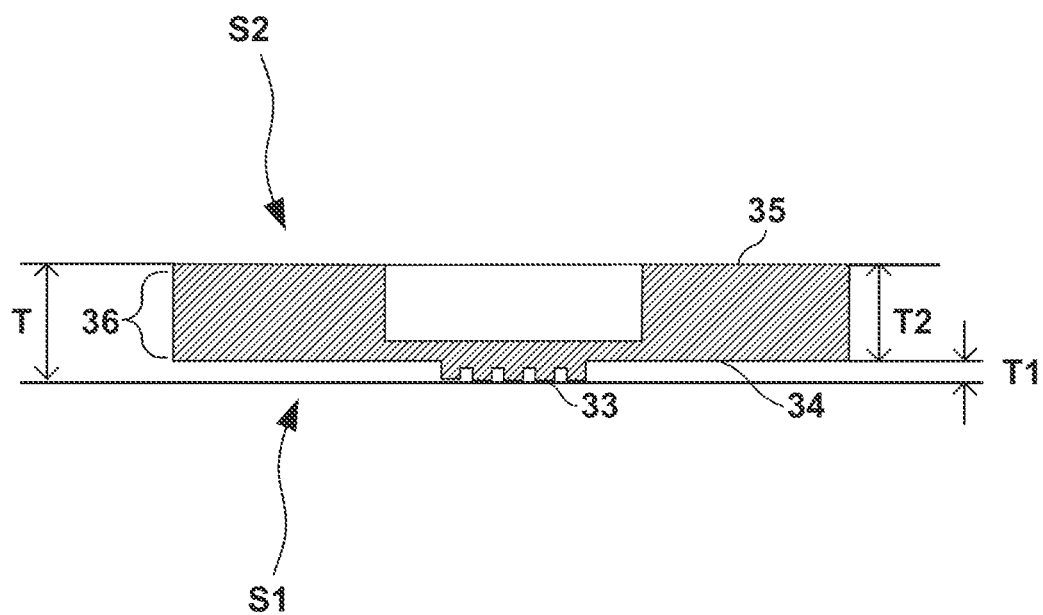
FIGS. 4A to 4F are views for explaining a driving correction amount in the handover of the mold of the first type and that in the handover of the mold of the second type.

FIG. 4A shows the definition of the dimensions of the mold 17 of the first type. A maximum thickness T is defined as the distance between the pattern region 33 of the first surface S1 and the second surface S2. A thickness (protrusion amount) T1 is defined as the height difference between the pattern region 33 and the peripheral region 34. A thickness T2 is the aforementioned thickness 36 and is defined as the distance between the peripheral region 34 of the first surface S1 and the held region 35 of the second surface S2. T=T1+T2. In one example, the maximum thickness T can be 6.35 mm, and the thickness Ti can be 20 μm (inclusive) to 40 μm (inclusive).

Figure 4B:
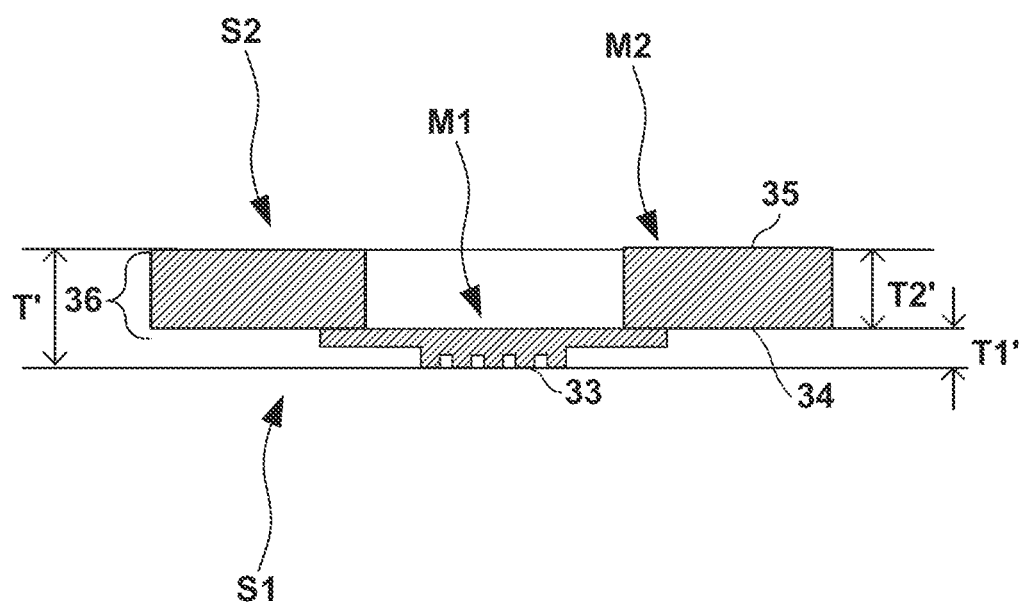

FIG. 4B shows the definition of the dimensions of the mold 17 of the second type. A maximum thickness T' is defined as the distance between the pattern region 33 of the first surface S1 and the second surface S2. A thickness (protrusion amount) T1' is defined as the height difference between the pattern region 33 and the peripheral region 34. A thickness T2' is the aforementioned thickness 36 and is defined as the distance between the peripheral region 34 of the first surface S1 and the held region 35 of the second surface S2. T'=T1'+T2'. The mold 17 of the second type can be manufactured by joining two members, that is, a first member M1 that includes the pattern region 33 and a second member M2 that includes the held region 35. To strengthen the first member M1, the thickness (thickness T1') of the first member M1 can be 1 mm or more. Although it is preferable for the maximum thickness T of the mold 17 of the first type and the maximum thickness T' of the mold 17 of the second type to be the same as each other, they may differ from each other.

Figure 4C:
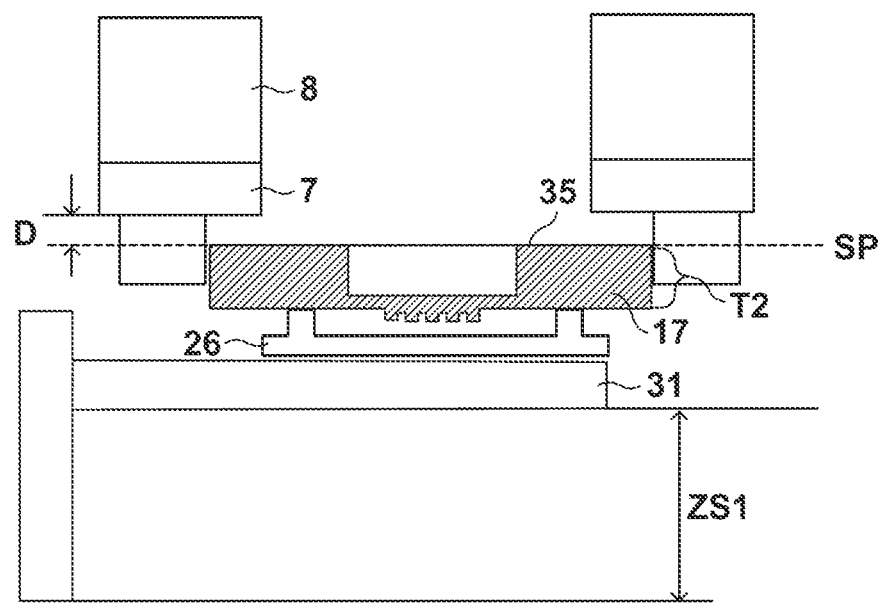

FIG. 4C schematically shows the state of the handover of the mold 17 of the first type from (the mold conveyance chuck 26 of) the mold conveyance mechanism 29 to (the mold chuck 7) of the mold driving mechanism 6. At this time, the mold 17 of the first type is driven by the mold conveyance mechanism 29 so as to position the held region 35 of the mold 17 of the first type at a first height SP below the mold chuck 7. Let ZS1 be a driving amount of the mold 17 in the Z-axis direction at this time. The driving amount ZS1 is determined by the thickness T2 of the mold 17 of the first type. A distance (height difference) D between the chuck surface of the mold chuck 7 and the first height SP is set to fall within a stroke (driving range) in the Z-axis direction of the mold driving mechanism 6.

Figure 4D:
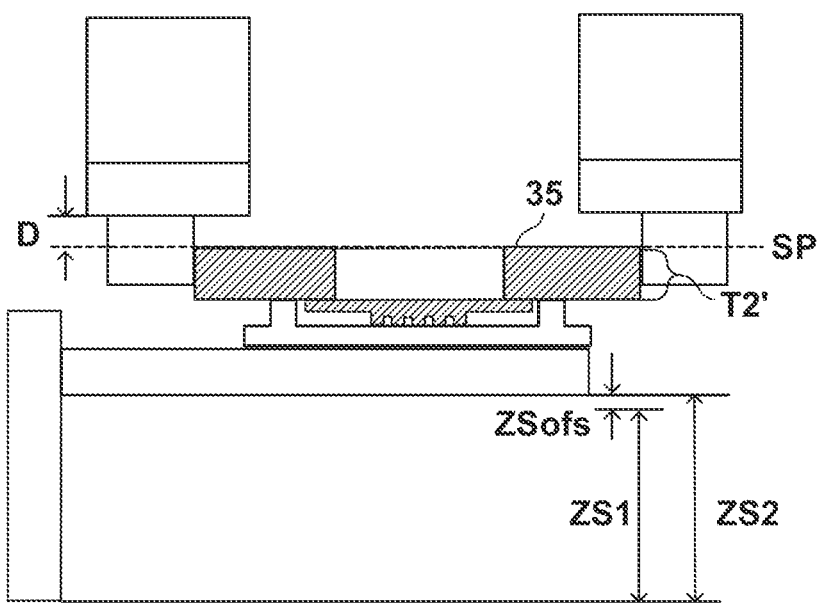

FIG. 4D schematically shows the state of the handover of the mold 17 of the second type from (the mold conveyance chuck 26 of) the mold conveyance mechanism 29 to (the mold chuck 7) of the mold driving mechanism 6. At this time, the mold 17 of the second type needs to be driven by the mold conveyance mechanism 29 so as to position the held region 35 of the mold 17 of the second type at the first height SP. Let ZS2 be a driving amount of the mold 17 of the second type in the Z-axis direction at this time. The difference between the driving amount ZS2 and the driving amount ZS1 is a driving correction amount ZSofs (=ZS2−ZS1). The driving correction amount ZSofs is the difference (T2−T2') between the thickness T2 of the mold 17 of the first type and the thickness T2' of the mold 17 of the second type. Here, the reference thickness and the reference driving amount of the thickness T2 and the driving amount ZS1, respectively, can be predetermined. Hence, the controller 19 can determine the driving correction amount ZSofs (=T2−T2') by obtaining the thickness information indicating the thickness T2' of the mold 17 of the second type or determine the driving amount ZS2 (=ZS1+ZSofs). Alternatively, the controller 19 can determine the driving amount ZS2 (=ZS1+T2−T2') based on the driving amount ZS1, the thickness T2, and the thickness T2'. The controller 19 can subsequently control the mold conveyance mechanism 29 (the conveyance of the mold 17 by the mold conveyance mechanism 29) based on the driving amount ZS2. More specifically, the controller 19 can control the mold conveyance mechanism 29 (the conveyance of the mold 17 by the mold conveyance mechanism 29) based on the driving amount ZS2 so that the held region 35 of the mold 17 will match the first height SP.

The first height SP is the height at which the held region 35 of the mold 17 is to be positioned by the mold conveyance mechanism 29 when the mold 17 of the first type and that of the second type each are to be handed over from (the mold conveyance chuck 26 of) the mold conveyance mechanism 29 to (the mold chuck 7 of) the mold driving mechanism 6.

Figure 4E:
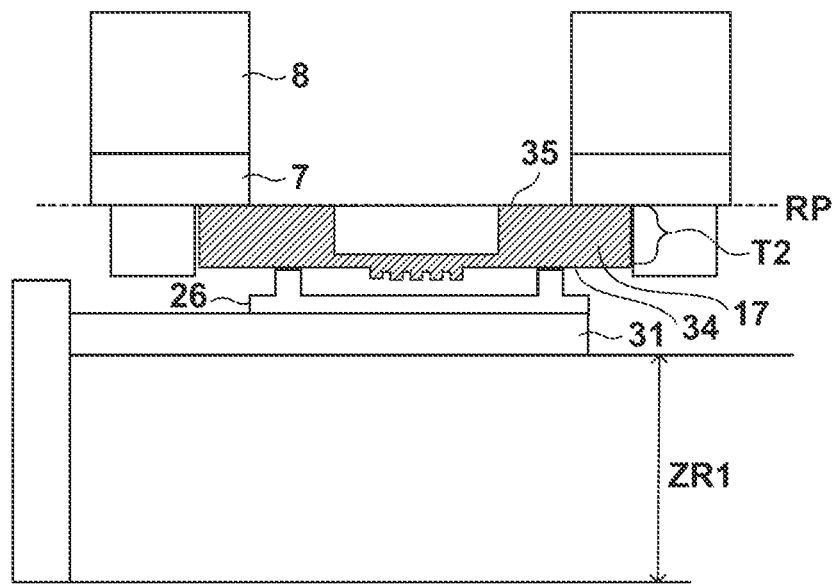

FIG. 4E schematically shows the state of the handover of the mold 17 of the first type from (the mold chuck 7 of) the mold driving mechanism 6 to (the mold conveyance chuck 26 of) the mold conveyance mechanism 29. At this time, the mold 17 is positioned by the mold driving mechanism 6 so as to match the held region 35 of the mold 17 of the first type to a second height RP. Here, the second height RP can be the same height as the first height SP but may be a height different from the first height SR. The second height RP is a height at which the held region 35 of the mold 17 is to be positioned by the mold driving mechanism 6 when the mold 17 of the first type and that of the second type each are to be handed over from (the mold chuck 7 of) the mold driving mechanism 6 to (the mold conveyance chuck 26 of) the mold conveyance mechanism 29.

To receive the mold 17 of the first type which has been positioned by the mold driving mechanism 6 so that the held region 35 will match the second height RP, the mold conveyance mechanism 29 drives the table 31 (mold conveyance chuck 26) so as to bring the mold conveyance chuck 26 into contact with the peripheral region 34 of the mold 17. At this time, let ZR1 be a driving amount of the table 31 (mold conveyance chuck 26) in the Z-axis direction. The driving amount ZR1 is determined by the thickness T2 of the mold 17 of the first type.

Figure 4F:
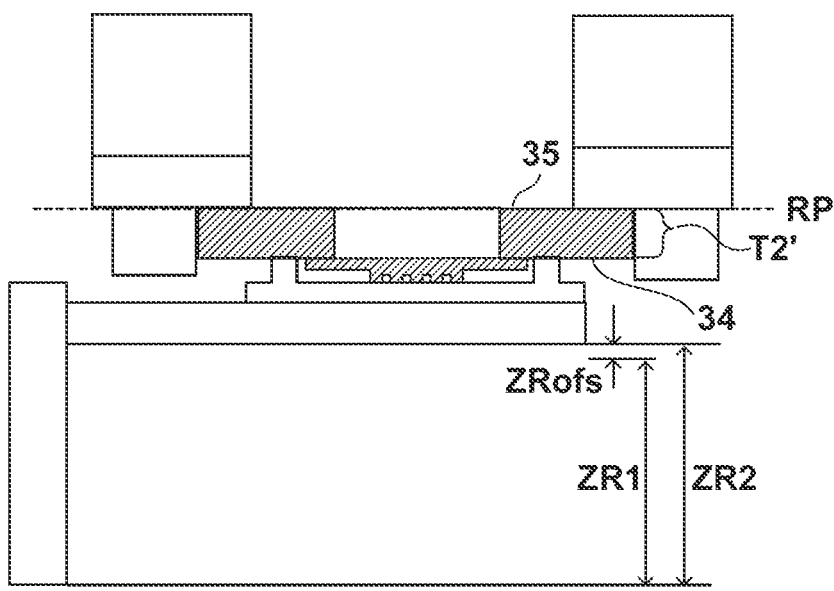

FIG. 4F schematically shows the state of the handover of the mold 17 of the second type from (the mold chuck 7 of) the mold driving mechanism 6 to (the mold conveyance chuck 26 of) the mold conveyance mechanism 29. At this time, the mold 17 is positioned by the mold driving mechanism 6 so that the held region 35 of the mold 17 of the second type will match the second height RP. To receive the mold 17 of the second type which has been positioned by the mold driving mechanism 6 so that the held region 35 will match the second height RP, the mold conveyance mechanism 29 drives the table 31 (mold conveyance chuck 26) so as to bring the mold conveyance chuck 26 into contact with the peripheral region 34 of the mold 17 of the second type. At this time, let ZR2 be a driving amount of the table 31 (mold conveyance chuck 26) in the Z-axis direction. The driving amount ZR2 is determined by the thickness T2' of the mold 17 of the second type.

The difference between the driving amount ZR2 and the driving amount ZR1 is a driving correction amount ZRofs (=ZR2−ZR1). The driving correction amount ZRofs is the difference (T2−T2') between the thickness T2 of the mold 17 of the first type and the thickness T2' of the mold 17 of the second type. Here, the thickness T2 and the driving amount ZR1 can be predetermined as the reference thickness and the reference driving amount, respectively. Hence, the controller 19 can determine the driving correction amount ZRofs (=T2−T2') by obtaining the thickness information indicating the thickness T2' of the mold 17 of the second type or determine the driving amount ZR2 (=ZR1+ZRofs). Alternatively, the controller 19 can determine the driving amount ZR2 (=ZR1+T2−T2') based on the driving amount ZR1, the thickness T2, and the thickness T2'. The controller 19 can subsequently control the mold conveyance mechanism 29 based on the driving amount ZR2. More specifically, the controller 19 can control the mold conveyance mechanism 29 based on the driving amount ZR2 so as to bring the mold conveyance chuck 26 into contact with the peripheral region 34 of the mold 17 whose held region 35 has been positioned by the mold driving mechanism 6 so as to match the second height RP.

Figure 5A:
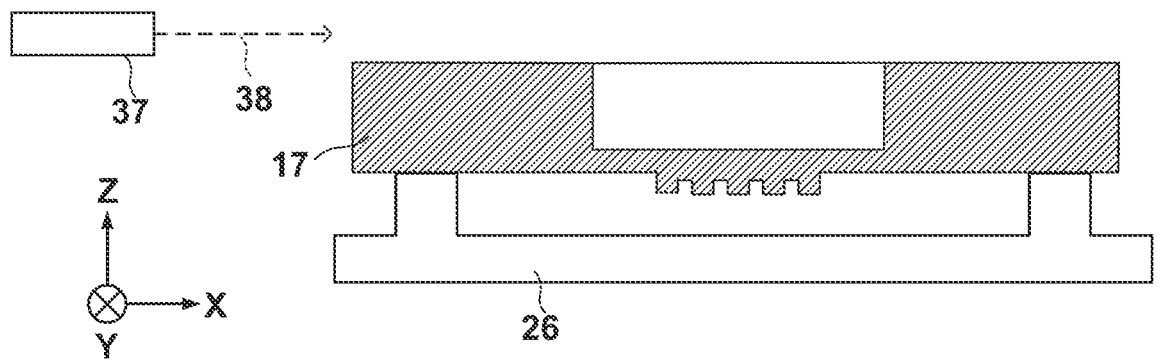
FIGS. 5A to 5C are schematic views showing a state in which the thickness of the mold is measured.
Figure 5B:
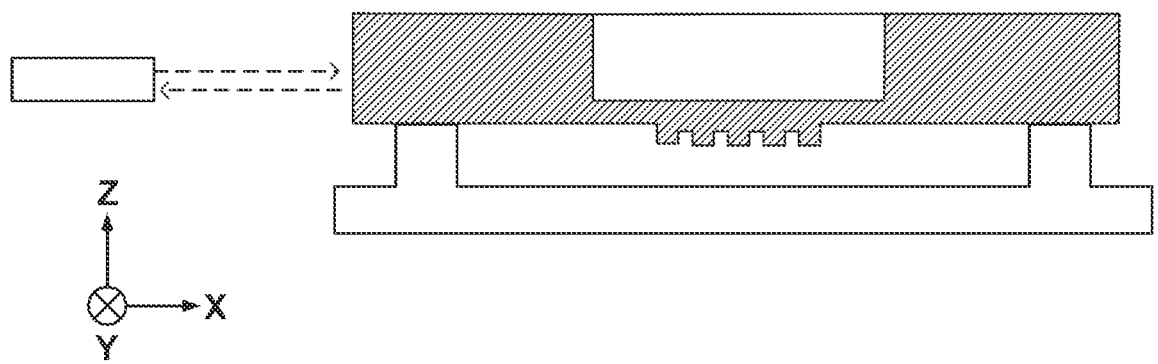
Figure 5C:
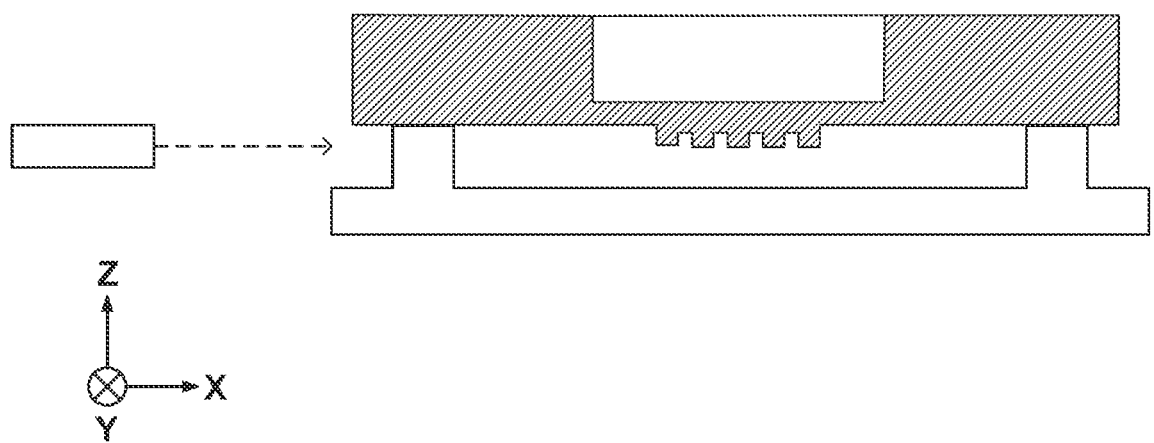

FIGS. 5A to 5C exemplify a state in which the thickness T2 or T2' of the mold 17 is measured. The imprint apparatus 1 can include a measurement device 37 that measures the thickness T2 or T2' of the mold 17. The measurement device 37 may be the first measurement device 25. In this case, other than obtaining the thickness information indicating the thickness T2, the first measurement device 25 is used to measure at least one of a position and an attitude of the mold 17.

In this example, the measurement device 37 emits measurement light 38 and detects the reflected light that is reflected and returned from the mold 17 which is the measurement target object. A state in which the reflected light returns to the measurement device 37 is the "light reception=ON" state, and a state in which the reflected light is not returned is the "light reception=OFF" state. As exemplified in FIGS. 5A to 5C, the mold 17 is driven by the mold conveyance mechanism 29 so that the side surface of the mold 17 held by the mold conveyance chuck 26 cuts across the measurement light 38 of the measurement device 37. The driving range of the mold 17 by the mold conveyance mechanism 29 may be preset in accordance with the range of the expected thickness of the mold 17 or the driving of the mold 17 by the mold conveyance mechanism 29 may be stopped in accordance with the state changing from the light reception=ON state to the light reception=OFF state. In this case, the measurement of the thickness T2 or T2' of the mold 17 can be completed in a shorter time. Note that the measurement method of the thickness T2 or T2' of the mold 17 is not limited to the above-described example, and various kinds of measurement methods can be adopted.

Figure 6:
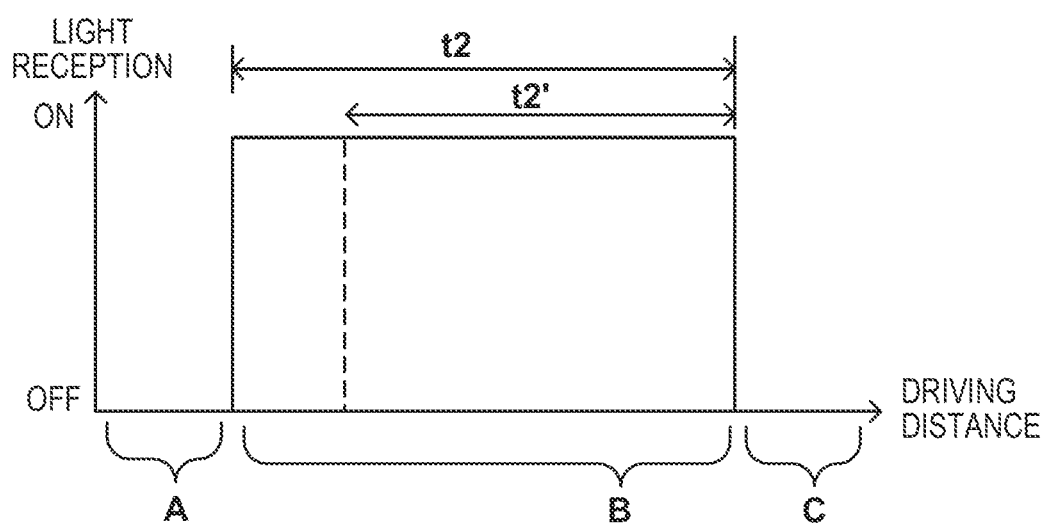
FIG. 6 is a schematic view showing light which is detected by a measurement device by the method exemplified in FIGS. 5A to 5C.

FIG. 6 exemplifies a light reception result of the reflected light from the side surface of the mold 17 obtained when the measurement device 37 measures the thickness T2 or T2' of the mold 17. A section A corresponds to the state shown in FIG. 5A, a section B corresponds to the state shown in FIG. 5B, and a section C corresponds to the state shown in FIG. 5C. At the measurement of the thickness T2 of the mold 17 of the first type, the light reception=ON period can be a width t2 corresponding to the thickness T2, and at the measurement of the thickness T2° of the mold 17 of the second type, the light reception=ON period can be a width t2' corresponding to the thickness T2'.

Figure 7:
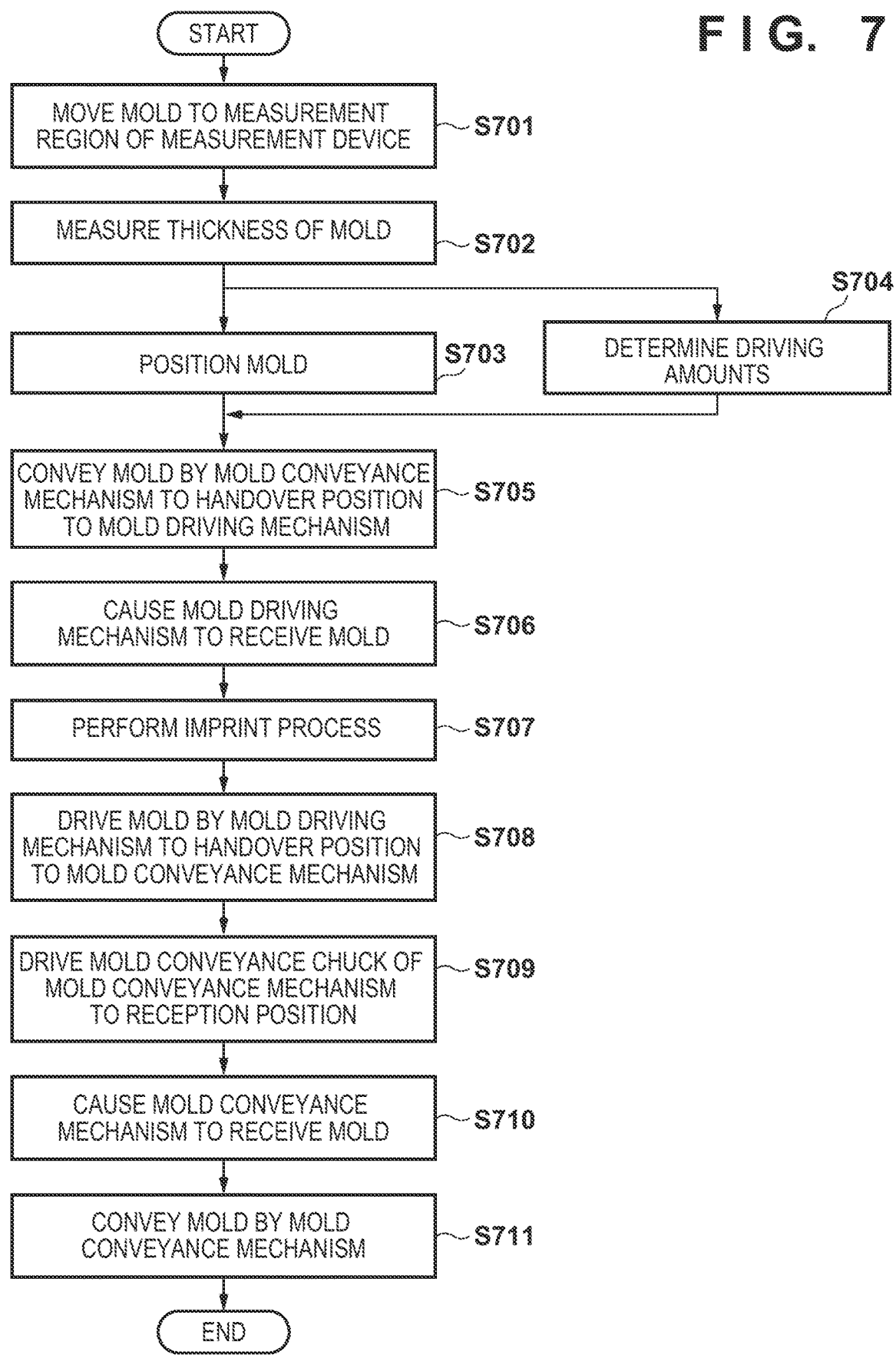
FIG. 7 is a flowchart showing an operation of an imprint apparatus according to the first embodiment.

FIG. 7 shows an operation of an imprint apparatus 1 according to the first embodiment. The operation shown in FIG. 7 is controlled by a controller 19. In step S701, for example, a mold 17 is conveyed by a conveying mechanism (not shown) from a carrier arranged in a load port to a mold conveyance chuck 26 of the mold conveyance mechanism 29, and the mold 17 is subsequently conveyed by the mold conveyance mechanism 29 to a measurement region of a measurement device 37. In step S702, a thickness T2 or T2' of the mold 17 is measured by the measurement device 37, and the thickness information of the thickness T2 or T2' is generated. The thickness information is stored in a memory 30 (for example, a non-volatile memory 40) and is referred to in step S704.

The following steps S703 and S704 may be executed in parallel or one of the steps may be executed ahead. In step S703, the mold 17 is positioned by a mold positioning mechanism 24. In step S704, the controller 19 determines driving amounts ZS2 and ZR2 based on the thickness information generated and stored in the memory 30 in step S702. Here, although the driving amounts to be used are driving amounts ZS1 and ZR1 in a case in which the mold 17 of a first type is to be used, the process may be executed by assuming that each mold is the mold 17 of the second type without discriminating between the first type and the second type. In this case, when the mold 17 of the first type is to be used, a measurement value represented as T2'=T2 is obtained from the measurement by the measurement device 37, ZSofs=0 and ZRofs=0, and thus the driving amounts ZS2=ZS1 and ZR2=ZR1. The driving amounts ZS2 and ZR2 will be used hereinafter, without discrimination between the first type and the second type, even when the mold 17 of the first type is used. The driving amounts ZS2 and ZR2 are stored in the memory 30 (for example, the non-volatile memory 40) and referred to in steps S705 and S709.

Here, the controller 19 can store, each time the thickness information is determined in step S702 by measuring the thickness T2' of the mold 17, the thickness information as the latest thickness information in the non-volatile memory 40. In this case, the driving amounts ZS2 and ZR2 are preferably determined in steps S705 and S709, respectively, based on the thickness information. As a result, even after the imprint apparatus 1 is temporarily stopped due to a power failure or the like, if the thickness information indicating the thickness T2' of the mold 17 has been stored in the non-volatile memory 40, the process can be restarted based on the stored thickness information. For example, in a case in which the imprint apparatus 1 is temporarily stopped before the mold 17 is handed over from the mold conveyance mechanism 29 to a mold driving mechanism 6 and the operation is subsequently restarted, the thickness T2' of the mold 17 need not be measured again by the measurement device 37. Also, even in a case in which the imprint apparatus 1 has been temporarily stopped, before step S709, after the thickness information has been stored in the non-volatile memory 40, the controller 19 can correctly recognize the thickness information of the mold 17 held by a mold chuck 7. Hence, when the mold 17 which is held by the mold chuck 7 is to be handed over to the mold conveyance mechanism 29, the mold conveyance chuck 26 of the mold conveyance mechanism 29 can be driven to the correct position to receive the mold 17.

Alternatively, each time the driving amounts ZS2 and ZR2 (control information for controlling the mold conveyance mechanism 29) are determined, the controller 19 can store these driving amounts ZS2 and ZR2 as the latest driving amounts ZS2 and ZR2 in the non-volatile memory 40. For example, in a case in which the imprint apparatus 1 is temporarily stopped before the mold 17 is handed over from the mold conveyance mechanism 29 to the mold driving mechanism 6 and the operation is subsequently restarted, the driving amounts ZS2 and ZR2 need not be determined again by re-measuring the thickness T2' of the mold 17 by the measurement device 37. Also, even if the imprint apparatus 1 has temporarily stopped due to a power failure or the like, the process can be restarted based on the latest driving amounts ZS2 and ZR2. Furthermore, even in a case in which the imprint apparatus 1 has been temporarily stopped, before step S709, after the driving amounts ZS2 and ZR2 have been stored in the non-volatile memory 40, the controller 19 can obtain the correct driving amount ZR2 corresponding to the thickness information of the mold 17 which is held by the mold chuck 7. Hence, when the mold 17 held by the mold chuck 7 is to be handed over to the mold conveyance mechanism 29, the mold conveyance chuck 26 of the mold conveyance mechanism 29 can be driven to the correct position to receive the mold 17.

In step S705, the controller 19 controls, based on the driving amount ZS2 determined in step S704, the driving of the mold 17 by the mold conveyance mechanism 29 so that a held region 35 of the mold 17 is positioned at a first height SP below the mold chuck 7. In step S707, the controller 19 controls the mold driving mechanism 6 so that the mold chuck 7 of the mold driving mechanism 6 will receive the mold 17 whose held region 35 has been positioned at the first height SP below the mold chuck 7.

In step S707, an imprint process on the shot region of a substrate 18 is executed by using the mold 17. The imprint process is performed, for example, on one or a plurality of substrates 18.

In step S708, the controller 19 controls the driving of the mold 17 by the mold driving mechanism 6 so that the held region 35 of the mold 17 will match a second height RP. In step S709, based on the driving amount ZR2 determined in step S704, the controller 19 raises a table 31 (mold conveyance chuck 26) by controlling the mold conveyance mechanism 29 so as to bring the mold conveyance chuck 26 into contact with a peripheral region 34 of the mold 17. In step S710, the controller 19 controls the mold driving mechanism 6 and the mold conveyance mechanism 29 so that the mold conveyance chuck 26 of the mold conveyance mechanism 29 will receive the mold 17 from the mold driving mechanism 6 and hold the mold. In step S711, the controller controls the mold conveyance mechanism 29 so as to convey the mold 17 to a predetermined position. Subsequently, the mold 17 can be conveyed by a conveyance mechanism (not shown) to, for example, a carrier arranged in a load port.

As described above, according to the first embodiment, regardless of the thickness T2 of the mold 17, the mold 17 can be handed over from the mold conveyance mechanism 29 to the mold driving mechanism 6 and the mold 17 can be handed over from the mold driving mechanism 6 to the mold conveyance mechanism 29.

Figure 8:
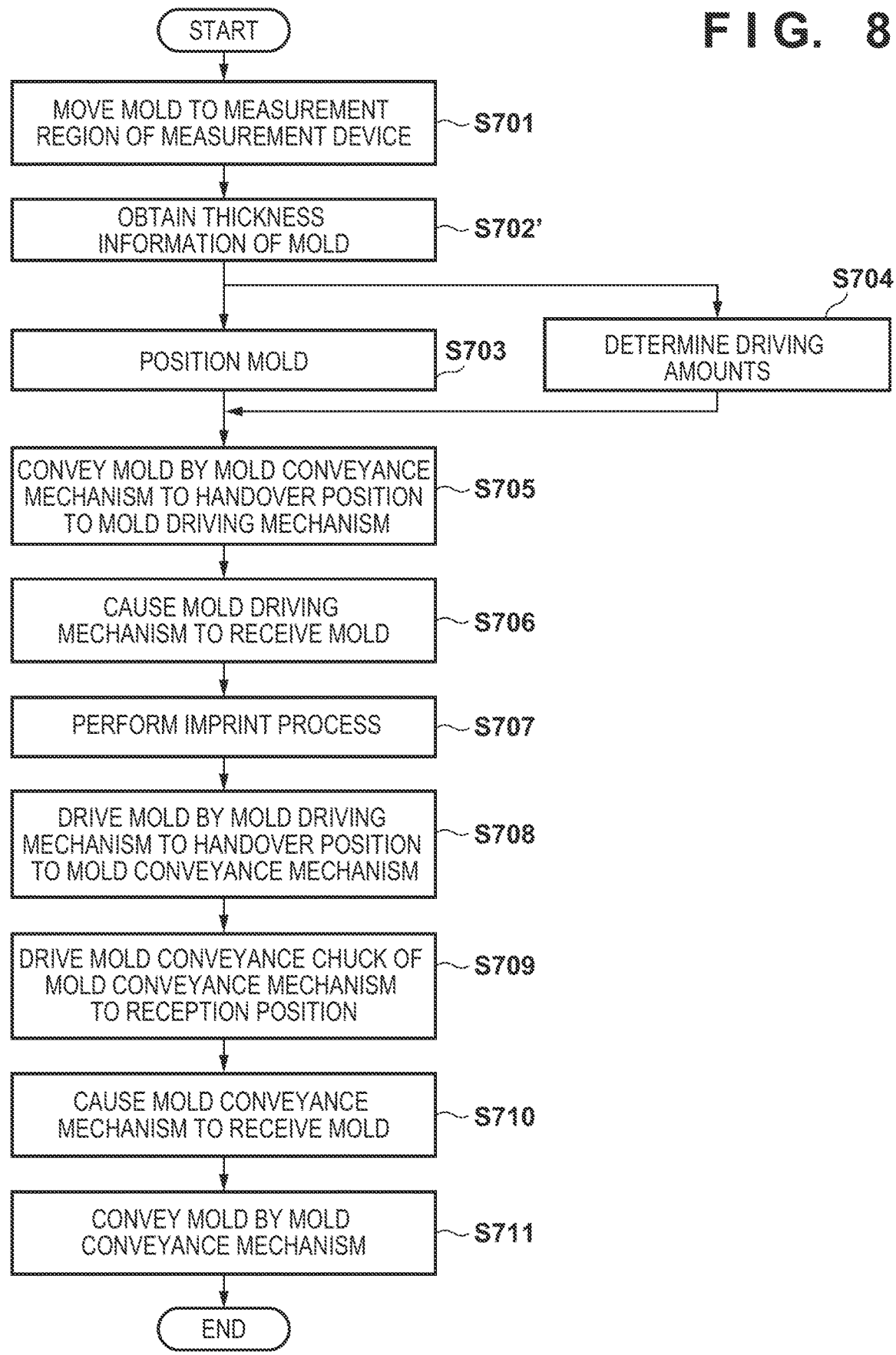
FIG. 8 is a flowchart showing an operation of an imprint apparatus according to the second embodiment.

FIG. 8 shows an operation of an imprint apparatus 1 according to the second embodiment. The operation shown in FIG. 8 is controlled by a controller 19. The second embodiment shown in FIG. 8 differs from the first embodiment in that step S702', in which the imprint apparatus 1 obtains the thickness information indicating a thickness T2' of a mold 17 based on information provided from an external apparatus 100, has been included in place of step S702 in the first embodiment.

Here, the information provided from the external apparatus 100 can include a plurality of pieces of thickness information (for example, a thickness T2 of the mold 17 of a first type and the thickness T2' of the mold 17 of a second type) associated with the respective plurality of types of the mold 17. In step S702', in the imprint apparatus 1, a discriminator can be used to discriminate the type of the mold 17, and thickness information corresponding to the type of the mold 17 can be obtained from the plurality of pieces of thickness information. For example, a measurement device 37 can be used as the discriminator. In this case, the measurement device 37 suffices to have a measurement accuracy that allows discrimination of the type of the mold 17.

The measurement device 37 which serves as the discriminator can employ, for example, a sensor that determines whether the height of a held region 35 of the mold 17 which is held by a mold conveyance chuck 26 falls within a predetermined range. The sensor can be arranged so that it can determine whether the height of the held region 35 falls within the predetermined range by irradiating the held region 35 with oblique incident light and determining whether reflected light from the held region 35 can be detected.

Such a discriminator can be used to determine whether the mold 17 of a wrong type has been provided to the imprint apparatus 1.

A pattern of a cured product formed by using an imprint apparatus is used permanently for at least some of various articles or used temporarily when the various articles are manufactured. The article includes an electric circuit element, an optical element, a MEMS, a recording element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes an imprint mold or the like.

The pattern of the cured product is used without a change as a constituent member of at least a part of the above-described article or used temporarily as a resist mask. The resist mask is removed after etching, ion implantation, or the like is performed in a processing step of the substrate.

Figure 9A:
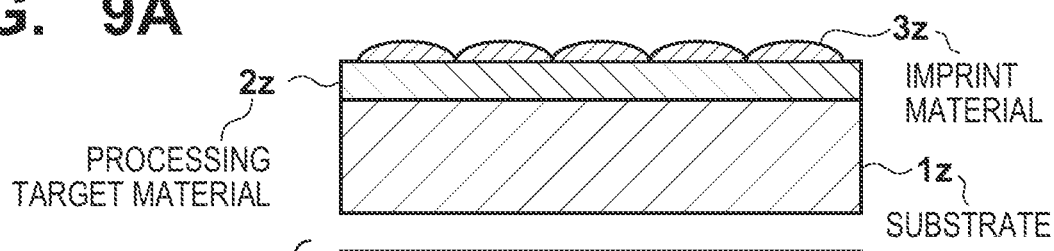
FIGS. 9A to 9F are views exemplifying an article manufacturing method.

An article manufacturing method of forming a pattern on a substrate by an imprint apparatus, processing the substrate on which the pattern has been formed, and manufacturing an article from the substrate on which the process has been performed will be described next. As shown in FIG. 9A, a substrate $1z$ such as a silicon wafer having a processing target material $2z$ such as an insulator formed on its surface is prepared, and then an imprint material $3z$ is applied on the surface of the processing target material $2z$ by an inkjet method or the like. A state is shown here in which the imprint material $3z$ formed into a plurality of droplets is applied on the substrate.

Figure 9B:
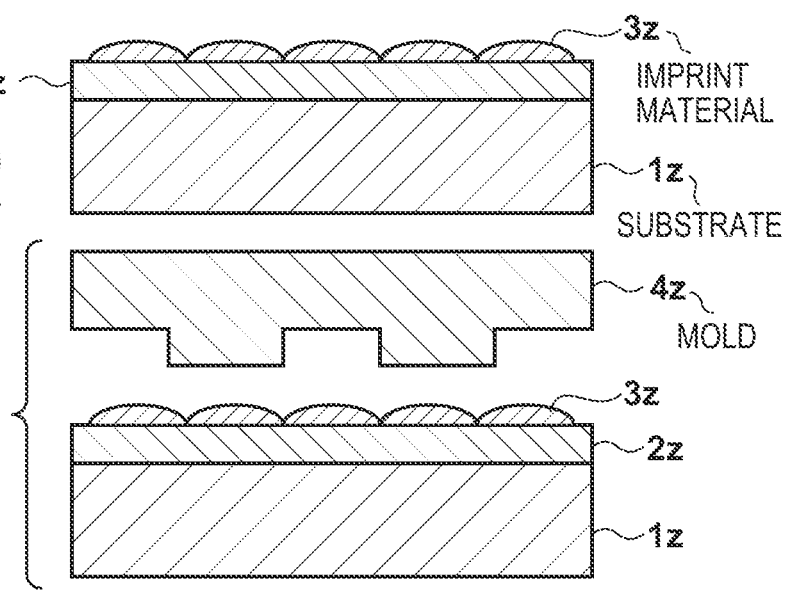
Figure 9C:
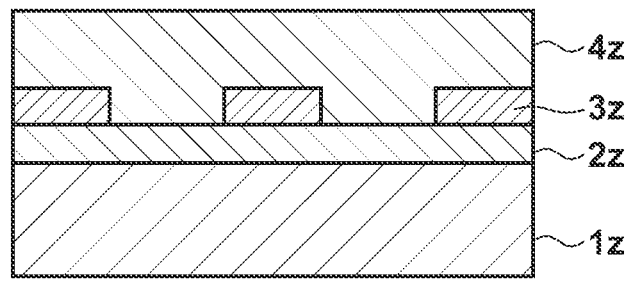

As shown in FIG. 9B, a side of an imprinting mold $4z$ on which its three-dimensional pattern is formed faces the imprint material $3z$ on the substrate. As shown in FIG. 9C, a mold $4z$ and the substrate $1z$ to which the imprint material $3z$ is applied are brought into contact with each other, and a pressure is applied. The imprint material $3z$ fills the gap between the mold $4z$ and the processing target material $2z$. The imprint material $3z$ is cured by irradiating it with light as curing energy through the mold $4z$ in this state.

Figure 9D:
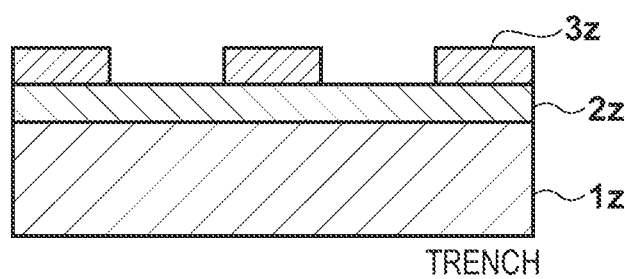

As shown in of FIG. 9D, the pattern of the cured product of the imprint material $3z$ is formed on the substrate $1z$ by releasing the mold $4z$ and the substrate $1z$ from each other after curing the imprint material $3z$. The pattern of this cured product has a shape such that the concave portion of the mold corresponds to the convex portion of the cured product, and the convex portion of the mold corresponds to the concave portion of the cured product. That is, the three-dimensional pattern of the mold $4z$ is transferred to the imprint material $3z$.

Figure 9E:
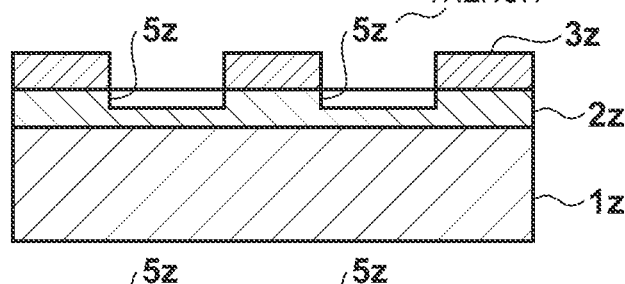
Figure 9F:
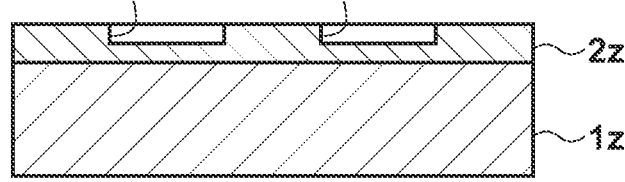

As shown in of FIG. 9E, out of the surface of the processing target material $2z$, portions without any cured product or portions where the cured products remain thin are removed and become trenches $5z$ by performing etching using the pattern of the cured product as an etching resistant mask. As shown in FIG. 9F, an article having the trenches $5z$ formed in the surface of the processing target material $2z$ can be obtained by removing the pattern of the cured product. The pattern of the cured product is removed here. However, the pattern of the cured product may be used as, for example, an interlayer dielectric film included in the semiconductor element or the like, that is, the constituent member of the article without removing it after processing.

Although the above description is related to an imprint apparatus, the mold may be read instead as an original and the imprint apparatus may be read instead as a pattern forming apparatus. The pattern forming apparatus can include, other than the imprint apparatus, an exposure apparatus such as an EUV exposure apparatus or the like. In the exposure apparatus such as an EUV exposure apparatus, a reticle is used as the original. The original that is used in the exposure apparatus such as an EUV exposure apparatus can be manufactured by processing low thermal expansion glass. Such an original can be manufactured by joining a base member and a member with a pattern and can have a plurality of types of thicknesses.

Such a pattern forming apparatus 1 is formed as an apparatus that forms a pattern on a substrate 18 by using an original 17. The original 17 can have a first surface S1 and a second surface S2 that are on sides opposite to each other. The first surface S1 can include a pattern region 33 which has a pattern to be transferred to the substrate 18 and a peripheral region 34 which surrounds the pattern region 33, and the second surface S2 can include a held region 35. The pattern forming apparatus 1 can include an original driving mechanism 6 which drives the original 17 by holding the held region 35 of the original 17 and an original conveyance mechanism 29 which conveys the original 17 by holding the peripheral region 34 of the original 17. The pattern forming apparatus 1 can include a controller 19 that controls the position of the original conveyance mechanism 29 based on thickness information indicating a distance (a thickness T2 or T2') between the peripheral region 34 and the held region 35 when the handover of the original 17 between the original driving mechanism 6 and the original conveyance mechanism 29 is to be executed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-136438, filed Jul. 12, 2017, which is hereby incorporated by reference herein in its entirety.

What is claimed is:

1. An imprint apparatus that forms a pattern on a substrate by bringing a pattern region of a mold into contact with an imprint material on the substrate and curing the imprint material,
wherein the mold has a first surface and a second surface on sides opposite to each other, the first surface including the pattern region and a peripheral region which surrounds the pattern region, the second surface including a held region, and
the imprint apparatus comprises
a mold driving mechanism configured to hold the held region of the mold and drive the mold,
a mold conveyance mechanism configured to hold the peripheral region of the mold and convey the mold, and
a controller configured to control, when handover of the mold is to be performed between the mold driving mechanism and the mold conveyance mechanism, the mold conveyance mechanism based on thickness information which indicates a distance between the peripheral region and the held region.

2. The apparatus according to claim 1, wherein the mold conveyance mechanism holds the peripheral region in a state in which the first surface faces downward, and the mold driving mechanism holds the held region in a state in which the first surface faces downward.

3. The apparatus according to claim 1, wherein the controller controls, when the mold conveyance mechanism is to hand over the mold to the mold driving mechanism, the mold conveyance mechanism based on the thickness information so as to position the held region at a first height.

4. The apparatus according to claim 1, wherein the controller controls, when the mold conveyance mechanism is to receive the mold from the mold driving mechanism, the mold driving mechanism so as to position the held region at a second height and controls the mold conveyance mechanism so as to receive the mold from the mold driving mechanism.

5. The apparatus according to claim 1, further comprising:
a mold positioning mechanism configured to position the mold with respect to the mold conveyance mechanism.

6. The apparatus according to claim 5, wherein the mold positioning mechanism comprises a mold conveyance chuck configured to hold the peripheral region of the mold and position the mold with respect to the mold conveyance mechanism in a state in which the peripheral region is held by the mold conveyance chuck, and
the mold conveyance mechanism conveys the mold by conveying the mold conveyance chuck.

7. The apparatus according to claim 5, further comprising:
a measurement device configured to obtain the thickness information by measuring the mold.

8. The apparatus according to claim 7, wherein the measurement device is arranged in the mold positioning mechanism.

9. The apparatus according to claim 8, wherein the measurement device is used, other than obtaining the thickness information, for measuring at least one of a position and an attitude of the mold.

10. The apparatus according to claim 1, further comprising:
a measurement device configured to obtain the thickness information by measuring the mold.

11. The apparatus according to claim 7, wherein the measurement device obtains the thickness information by measuring the mold which is held by the mold conveyance mechanism.

12. The apparatus according to claim 1, wherein the controller obtains the thickness information based on information provided from an external apparatus.

13. The apparatus according to claim 12, further comprising:
a discriminator configured to discriminate a type of the mold,
wherein the information includes a plurality of pieces of thickness information associated with a plurality of types of molds, respectively, and
the controller obtains, from the plurality of pieces of thickness information, the thickness information corresponding to the type of the mold in accordance with the type discriminated by the discriminator.

14. The apparatus according to claim 1, wherein the controller stores, each time the thickness information of the mold is determined, the thickness information as the latest thickness information in a non-volatile memory.

15. The apparatus according to claim 1, wherein the controller determines control information for controlling the mold conveyance mechanism based on the thickness information of the mold and stores the control information in a non-volatile memory.

16. The apparatus according to claim 1, wherein the controller stores, each time the thickness information of the mold is determined, the thickness information as the latest thickness information in a non-volatile memory, and controls the mold conveyance mechanism based on the latest thickness information stored in the non-volatile memory when the mold is to be handed over from the mold driving mechanism to the mold conveyance mechanism.

17. The apparatus according to claim 1, wherein the controller determines control information for controlling the mold conveyance mechanism based on the thickness information of the mold, and the controller stores, each time the control information is determined, the control information as the latest control information in a non-volatile memory, and controls the mold conveyance mechanism based on the latest control information stored in the non-volatile memory when the mold is to be handed over from the mold driving mechanism to the mold conveyance mechanism.

18. An article manufacturing method comprising:

forming a pattern on a substrate by using an imprint apparatus defined in claim 1;

processing the substrate on which the pattern has been formed in the forming; and manufacturing an article from the processed substrate.

19. A pattern forming apparatus that forms a pattern on a substrate by using an original, wherein the original has a first surface and a second surface on sides opposite to each other, the first surface including a pattern region which includes a pattern to be transferred onto the substrate and a peripheral region which surrounds the pattern region, the second surface including a held region, and the pattern forming apparatus comprises an original driving mechanism configured to hold the held region of the original and drive the original, an original conveyance mechanism configured to hold the peripheral region of the original and convey the original, and a controller configured to control, when handover of the original is to be performed between the original driving mechanism and the original conveyance mechanism, the original conveyance mechanism based on thickness information which indicates a distance between the peripheral region and the held region.

* * * * *